United States Patent
Sanchez et al.

(10) Patent No.: US 6,921,961 B2
(45) Date of Patent: Jul. 26, 2005

(54) SEMICONDUCTOR DEVICE HAVING ELECTRICAL CONTACT FROM OPPOSITE SIDES INCLUDING A VIA WITH AN END FORMED AT A BOTTOM SURFACE OF THE DIFFUSION REGION

(75) Inventors: Hector Sanchez, Cedar Park, TX (US); Michael A. Mendicino, Austin, TX (US); Byoung W. Min, Austin, TX (US); Kathleen C. Yu, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/946,758

(22) Filed: Sep. 22, 2004

(65) Prior Publication Data

US 2005/0042867 A1 Feb. 24, 2005

Related U.S. Application Data

(62) Division of application No. 10/641,544, filed on Aug. 15, 2003, now Pat. No. 6,838,332.

(51) Int. Cl.$^7$ .......................... H01L 29/00; H01L 29/06; H01L 29/40
(52) U.S. Cl. .......................... 257/532; 257/618; 257/621
(58) Field of Search ............................... 257/532, 618, 257/621

(56) References Cited

U.S. PATENT DOCUMENTS

| | | | |
|---|---|---|---|
| 5,378,914 A | * 1/1995 | Ohzu et al. | 257/369 |
| 5,426,072 A | 6/1995 | Finnia | 438/107 |
| 5,473,181 A | 12/1995 | Schwalke et al. | 257/390 |
| 5,614,743 A | 3/1997 | Mochizuki | 257/276 |
| 5,949,140 A | 9/1999 | Nishi et al. | 257/728 |
| 6,252,300 B1 | 6/2001 | Hsuan et al. | 257/686 |
| 6,355,501 B1 | 3/2002 | Fung et al. | 438/107 |
| 6,358,828 B1 | 3/2002 | Kadosh et al. | 438/586 |
| 6,500,724 B1 | 12/2002 | Zurcher et al. | 438/384 |

OTHER PUBLICATIONS

Hayashi, Y. et al.; Fabrication of Three–Dimensional IC Using "Cumulatively Bonded IC" (Cubic) Technology, 1990 Symposium on VLSI Technology, pp. 95–96; CH2874–6/90/0000–0095, IEEE.

Hayashi, Y. et al.; A New Three Dimension IC Fabrication Technology, Stack Thin Film Dual CMOS Layers, IEDN, 1991, pp. 25.6.1–25.6.4, CH3075–9/91/0000–0657, IEEE.

Wu, Joyce H.; A High Aspect–Ratio Silicon Substrate–Via Technology and Applications, Master of Science in Electrical Engineering Thesis, Massachusetts Institute of Technology, Aug. 2000, pp. 1–90 (no p. 34 or 54), MIT.

Armacost, M. et al.; A High Realiability Metal Insulator Metal Capacitor for 0.18 $\mu$m Copper Technology, IEEE, 2000, 4 pages, IEEE.

* cited by examiner

*Primary Examiner*—W. David Coleman
*Assistant Examiner*—William M. Brewster
(74) *Attorney, Agent, or Firm*—Robert L. King; Daniel D. Hill

(57) ABSTRACT

A semiconductor (10) has an active device, such as a transistor, with a directly underlying passive device, such as a capacitor (75, 77, 79), that are connected by a via or conductive region (52) and interconnect (68, 99). The via or conductive region (52) contacts a bottom surface of a diffusion or source region (22) of the transistor and contacts a first (75) of the capacitor electrodes. A laterally positioned vertical via (32, 54, 68) and interconnect (99) contacts a second (79) of the capacitor electrodes. A metal interconnect or conductive material (68) may be used as a power plane that saves circuit area by implementing the power plane underneath the transistor rather than adjacent the transistor.

11 Claims, 15 Drawing Sheets

SEMICONDUCTOR DEVICE HAVING ELECTRICAL CONTACT FROM OPPOSITE SIDES INCLUDING A VIA WITH AN END FORMED AT A BOTTOM SURFACE OF THE DIFFUSION REGION

This is a division of application Ser. No. 10/641,544, filed Aug. 15, 2003, now U.S. Pat. No. 6,838,332.

FIELD OF THE INVENTION

This invention relates generally to integrated circuits, and more specifically, to making electrical contact to semiconductor circuit elements.

BACKGROUND OF THE INVENTION

Present day semiconductors utilize decoupling capacitors built using transistor gates. Decoupling capacitors are needed to prevent voltage drops in the internal supplies of an integrated circuit when large amounts of switching activity occur. However, the advances in technologies are requiring the use of thin gate oxides that result in a non-ideal gate capacitor current leakage. In addition, these capacitors consume valuable circuit layout area and thus the utilization of such capacitors is limited. Gate capacitor current leakage also results in wasted power consumption that is critical in low-power applications. The leakage may be mitigated, but at the expense of total decoupling capacitance and process complexity. Because of a large distance between the decoupling capacitor and active circuitry, the high frequency response of the decoupling capacitor is limited. The distance must be large because placement of the decoupling capacitor is limited and typical placement of the decoupling capacitor is further removed from active circuitry than desired. Existing decoupling capacitor structures therefore either suffer from power consumption issues, size issues and/or electrical efficiency.

BRIEF DESCRIPTION OF THE DRAWINGS

The present invention is illustrated by way of example and not limitation in the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Figure 1:
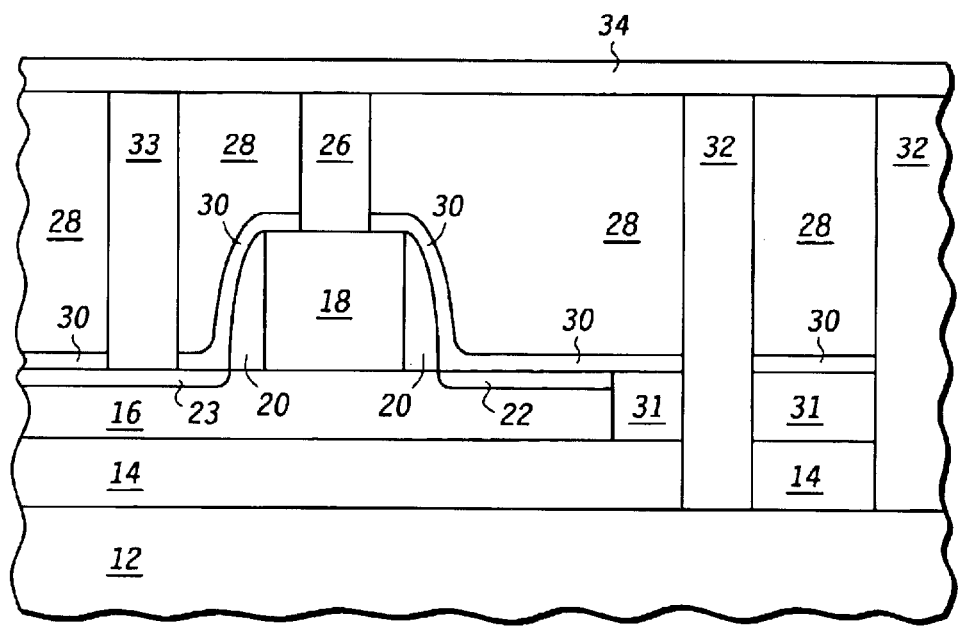
FIGS. 1–3 illustrate in cross-sectional form front side patterning and wafer bonding and thinning of a semiconductor in accordance with an embodiment of the invention.

Illustrated in FIG. 1 is a semiconductor device 10 in accordance with the present invention. It should be understood that the terms "over", "overlying" and "above" are defined herein for layers and structures formed with respect to the specific orientation of each figure discussed herein. For example, in FIGS. 1, 2 and 19, the term "over" is used with reference to anything vertically above the illustrated substrate 12. However, the illustrations of FIGS. 3–18 provide an inverse orientation of FIGS. 1, 2 and 19. The term "over" will continue to be used in the discussion even though such structures are actually below substrate 12 with respect to the original orientation of FIGS. 1 and 2. It should also be apparent that semiconductor device 10 and all embodiments thereof is operational not only in the illustrated orientations but also at any orientation, whether 90, 180 degrees or any other orientation. Also, multiple implementations of semiconductor device 10 may be made wherein the orientation of the various devices will vary. An active layer 16 is bonded onto insulating layer 14 and resides over substrate 12. In one form, active layer 16 is a semiconductor layer formed of bonded silicon, GaAs or SiGe or other semiconductive materials. Substrate 12 may be implemented with any material that provides suitable mechanical support for the elements of semiconductor device 10 and its formation.

Active devices and contacts to be described herein are patterned using conventional processing techniques and will not be discussed in specific detail. These include polysilicon gate 18, sidewall spacer 20, backside source region 22, drain region 23, gate contact 26, oxide 28, insulating etch stop layer 30, oxide 31 and backside contacts 32. The gate is a control electrode and the source and drain are current electrodes of a transistor. Source region 22 and drain region 23 are each a diffusion region and respectively function as a first current electrode and a second current electrode of a transistor with gate contact 26 functioning as a control electrode of the transistor. A drain contact 33 makes electrical connection to the drain region 23. Oxide 28 is an oxide layer of any conventional oxide material used in semiconductors. It should be understood that a thin gate oxide (not shown) is underneath polysilicon gate 18. Backside contacts 32 extend through active layer 16 and buried insulating layer 14. It should be noted that in other embodiments, the backside contacts 32 may not extend beyond a bottom surface of the oxide 31 making the backside contacts 32 have approximately a same depth as drain contact 33.

An etch stop layer 34 is deposited over oxide 28, drain contact 33 and backside contacts 32. As illustrated, backside contacts 32 represent conventional metallization and include the necessary layers for successful deposition, metal confinement and reliability. Backside contacts 32 and drain contact 33 function as a via or interconnect structure.

The insulating layer 14, in one form, may be implemented with $SiO_2$ and functions as an etch stop for the subsequent removal of substrate 12. This structure forms a silicon-on-insulator (SOI) structure. However, it should be appreciated that the structures provided herein may be implemented with a bulk substrate that does not contain insulating layer 14 or active layer 16. It should be noted that backside contacts 32 extend at least to a plane of the lower or first surface of active layer 16 if not all the way to substrate 12.

Figure 2:
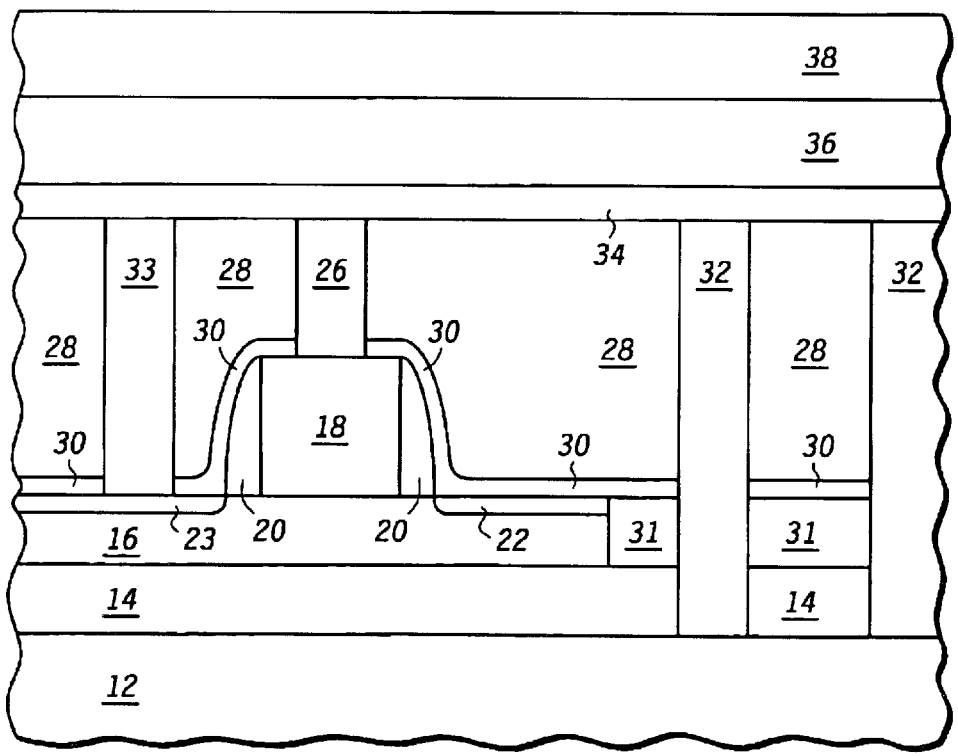

Illustrated in FIG. 2 is semiconductor device 10 wherein a carrier substrate 38 is connected to etch stop layer 34 via bonding layer 36. Bonding layer 36 may include materials such as oxide or polymer based bonding such as BCB or polyimide. Carrier substrate 38 functions as a mechanical support to allow subsequent removal of substrate 12 and handling of the semiconductor device 10. It should be apparent that the carrier substrate 38 may also have active circuitry and does not necessarily need to function as a sacrificial layer to be subsequently removed. In addition, metal to metal type bonding may be used wherein the etch stop layer 34 is not required and there is a direct connection between the carrier substrate 38 and backside contacts 32, gate contact 26 and drain contact 33.

Figure 3:
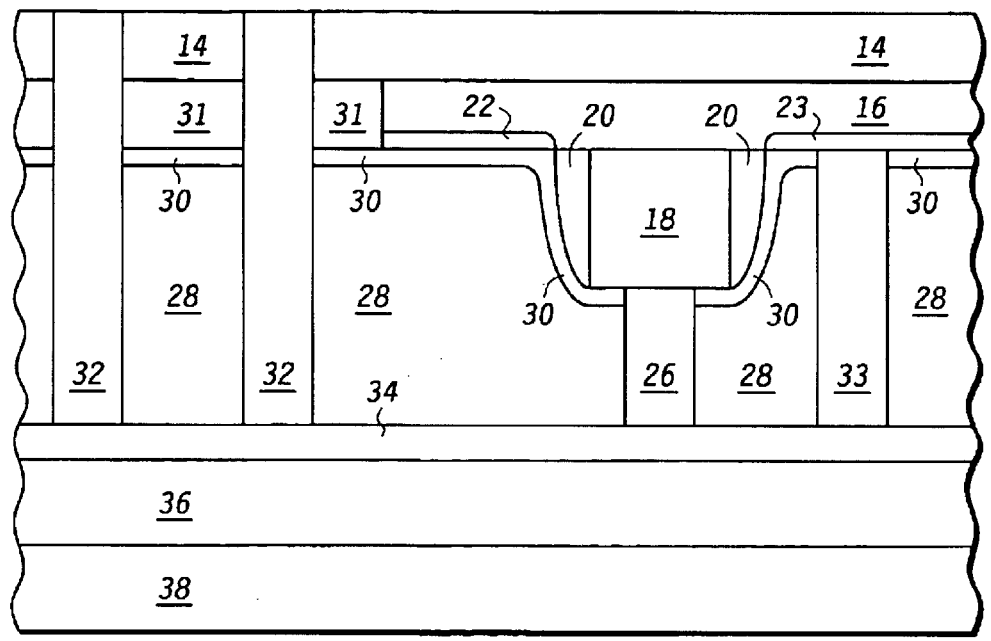

Illustrated in FIG. 3 is semiconductor device 10 wherein the original substrate 12 has been removed. This removal process may include conventional techniques such as grinding, chemical mechanical polish (CMP), wet or dry etching selective to the insulating layer 14. In addition, this removal process may include non-contact removal techniques such as laser lift-off, decomposition of the adhesive material, decomposition of bonds, etc. Given that the carrier substrate 38 provides mechanical support, carrier substrate 38 now becomes a bottom surface for device handling. In the bonding and substrate removal process, the orientation of semiconductor device has been reversed one hundred eighty degrees in order to facilitate backside processing. Therefore, semiconductor device 10 is inverted in FIG. 3 as compared with FIG. 2. Contact to the source region 22 is not illustrated but may be made from the topside by conventional methods or from the backside as taught herein.

Figure 4:
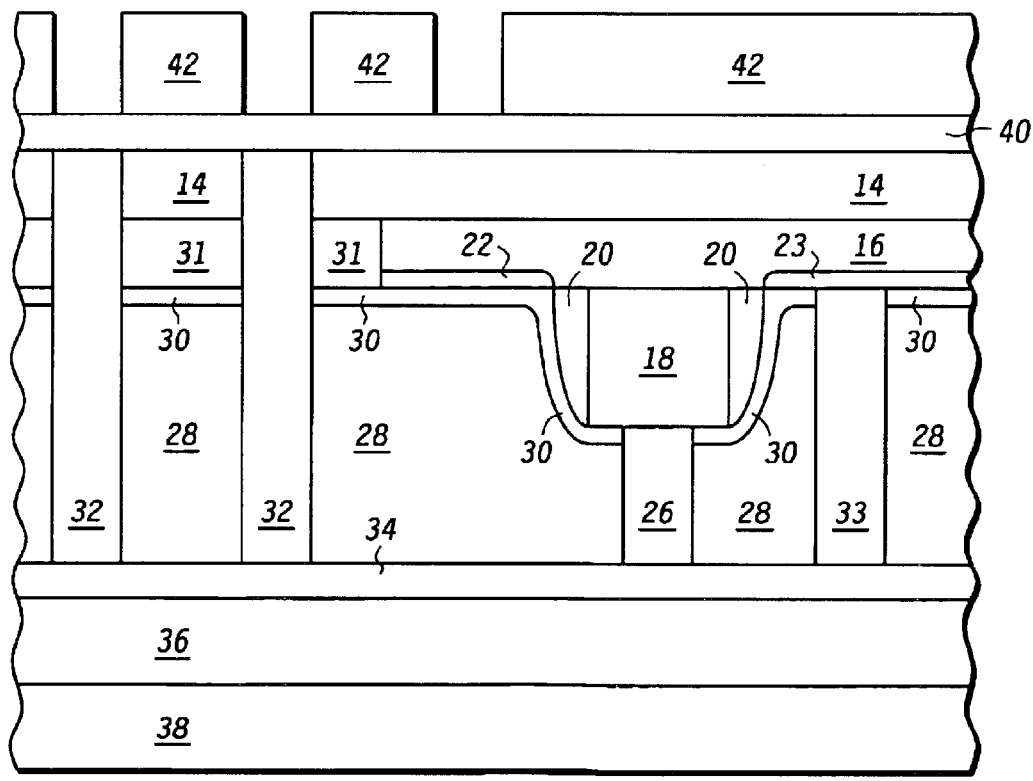
FIGS. 4–19 illustrate in cross-sectional form back side patterning and decoupling capacitor formation with distributed power planes in accordance with an embodiment of the present invention.

Illustrated in FIG. 4 is semiconductor device 10 wherein photoresist layer 42 defines openings that align with backside contacts 32 and backside source region 22. Alternatively, these contacts could connect to other device features such as the drain region 23 from the backside, the polysilicon gate 18 or to any element of an active device such as a diode (not shown) or a passive device such as a resistor (not shown), etc. Layer 40 as illustrated in FIG. 4 is an antireflective coating (ARC) or a hard mask to assist in accurate patterning. This layer 40 is optional depending upon feature sizes and processing accuracy. Layer 40 may be either conductive or insulative, but if layer 40 is conductive the layer 40 must be removed from the final structure of semiconductor device 10.

Figure 5:
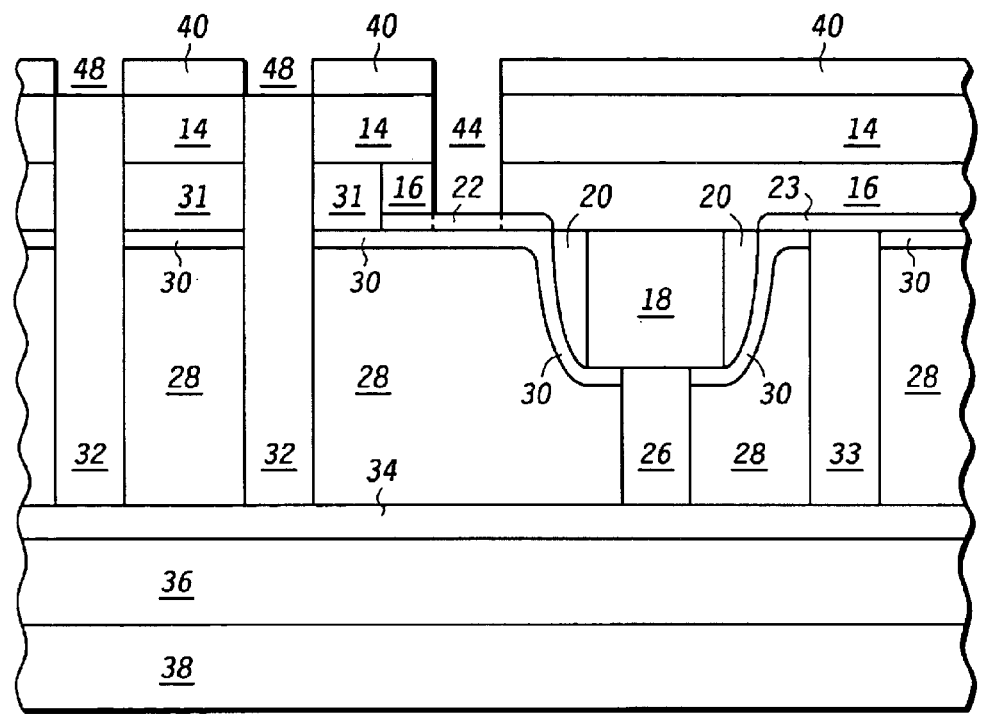

Illustrated in FIG. 5 is semiconductor device 10 wherein the pattern defined in photoresist layer 42 has been transferred into layers 40, 14 and 16 using either dry or wet etch processing or a combination thereof. The photoresist layer 42 is then removed and opening 44 and openings 48 are created pursuant to the pattern. Opening 44 defines a contact region to backside source region 22. It should be noted that the etch process that is performed in order to transfer the pattern is controlled to stop on the backside source region 22 without consuming a significant portion of the backside source region 22. However, in another embodiment the controlled etch through opening 44 extends through a portion or all of the backside source region 22 as illustrated in FIG. 5 by non-continuous lines for the side boundaries. In the first embodiment, a two-step etch process is used. The first step is an oxide-based etch and the second step is a silicon-based etch. The silicon-based etch may be implemented as a timed etch. Openings 48 define a contact region adjacent to backside contacts 32. Alternatively, opening 44 and openings 48 could be defined in separate patterning and etching steps. Additionally, the need for openings 48 may be avoided by over-etching layer 14 in FIG. 3 such that the backside contacts 32 protrude and are coplanar with a plane at the top of opening 44. The need for openings 48 may also be avoided by not using the optional layer 40. Also, in the illustrated form of FIG. 5, the photoresist layer 42 is then removed. In yet another embodiment, two vertically abutted contacts (not shown), one above backside source region 22 and one below backside source region, may be electrically joined within the backside source region 22 in order to make a contact having the same height as backside contacts 32.

Figure 6:
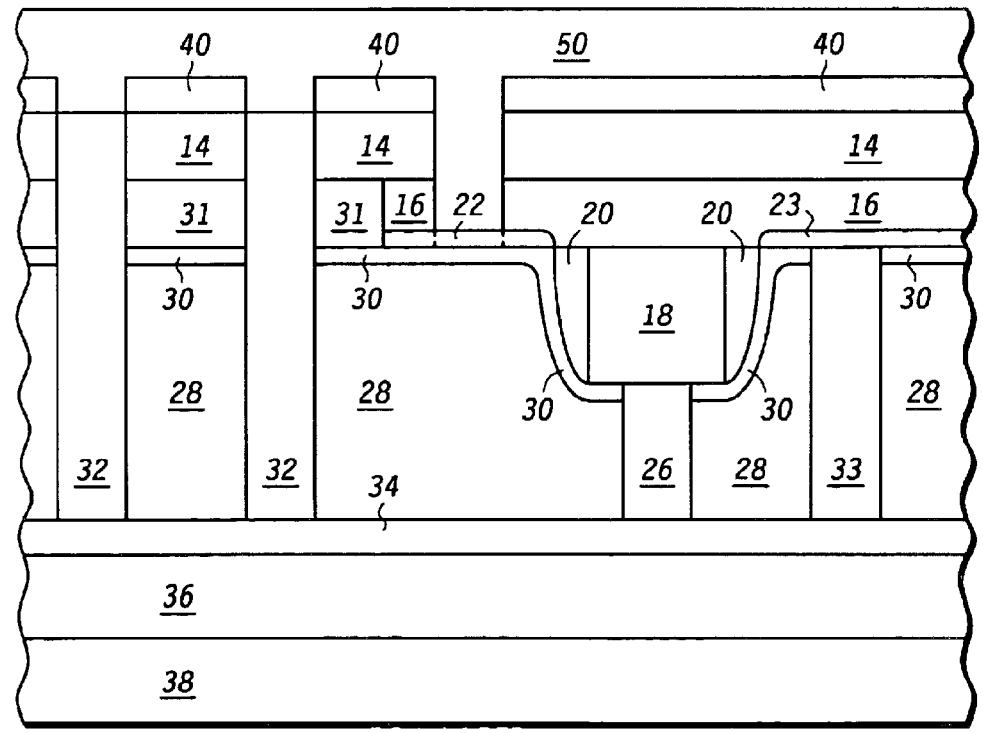

Illustrated in FIG. 6 is semiconductor device 10 wherein conductive layer 50 makes electrical contact to backside contacts 32 and backside source region 22. This conductive layer 50 may include copper, tungsten, silver, gold, aluminum or other conductors, in addition to appropriate barrier materials.

Figure 7:
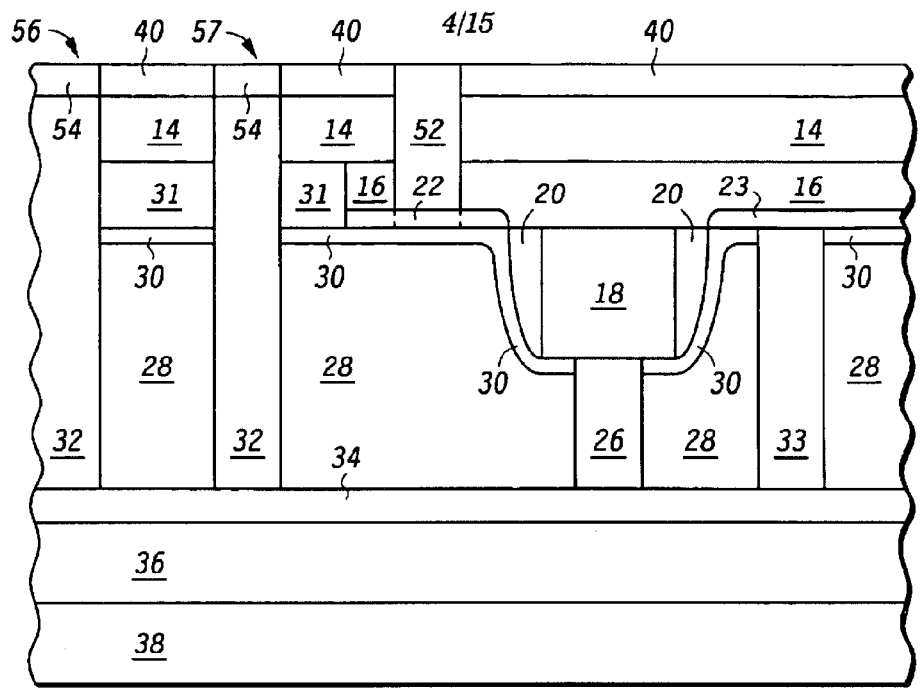

Illustrated in FIG. 7 is semiconductor device 10 wherein conductive layer 50 is planarized using CMP or electropolish or other conventional techniques. The planarization forms a via or conductive region 52 and conductive regions 54 that have differing heights. Active layer 16 has a first surface and an opposite second surface where backside source region 22 is formed in the first surface. Source region 22 has a top surface and a bottom surface. Conductive region 52 is formed in active layer 16 and has a first end that is formed at the second surface of active layer 16. Conductive region 52 has a second end that is formed in the bottom surface of source region 22. It should again be noted that if openings 48 are avoided as mentioned above, then conductive regions 54 are not formed. It should be noted that the heights do not have to differ as backside contacts 32 may be etched to an amount where the heights are substantially the same. In the event that conductive regions 54 are defined, one of conductive regions 54 and one of backside contacts 32 forms via 56 and via 57, respectively. It should be understood that the opening for conductive region 52 may, in an alternate embodiment, be etched through backside source region 22 as noted by the dashed lines in FIG. 7. In such an embodiment, the backside source region 22 completely surrounds the conductive region 52 and conductive region 52 extends through the backside source region 22 to the first surface of active layer 16. It should be observed that at this point in the processing there has been provided a semiconductor device 10 a semiconductor layer having a first surface and a second surface. The second surface is opposite the first surface. A diffusion region in the form of backside source region 22 is formed at the first surface of the semiconductor layer. The diffusion region has a top surface at the first surface of the semiconductor layer and a bottom surface. A via as represented by the conductive region 52 is formed in the semiconductor layer. A portion of the via has a first end formed at or above (i.e. extending into layer 40) the second surface and a second end formed at or below the bottom surface of the diffusion region (i.e. extending into backside source region 22).

Figure 8:
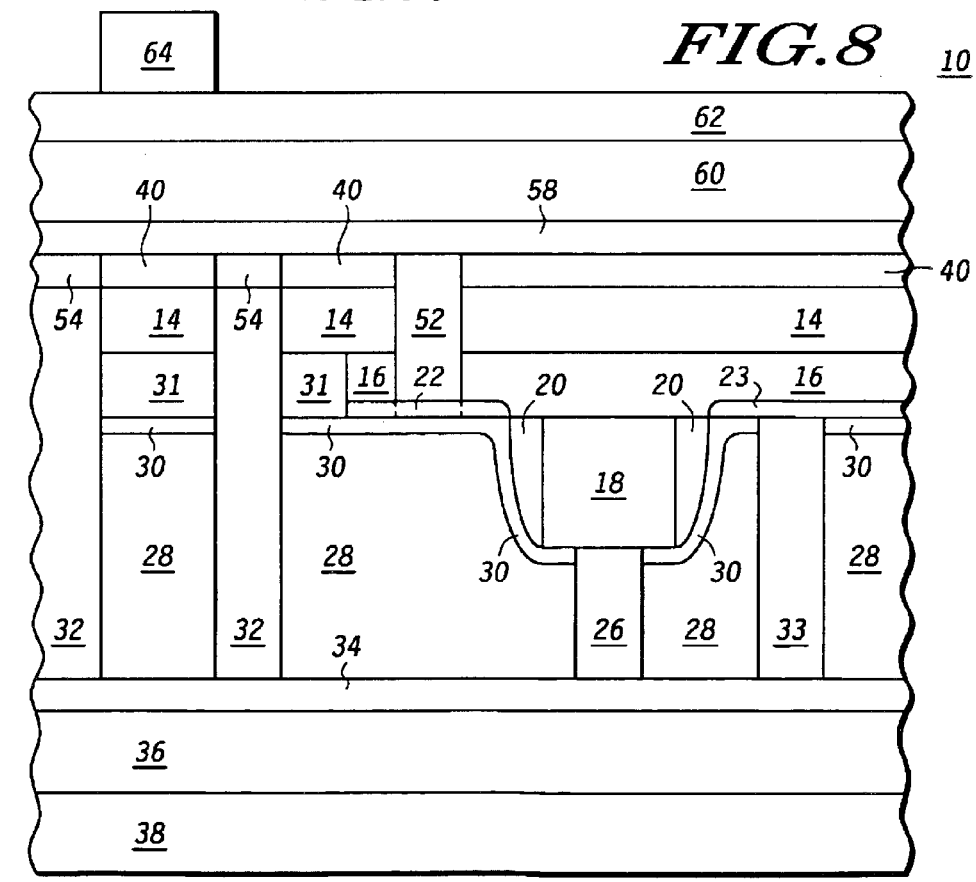

Illustrated in FIG. 8 is semiconductor device 10 wherein layers 58, 60 and 62 are formed overlying layer 40. In one form, the layer 58 is a dielectric and acts as an etch stop form. Layer 60 functions as a low k dielectric where "low k" is generally 4.0 or less. Layer 62 acts as an antireflective coating (ARC) material or as a hard mask material and may be either insulating or conducting. It should be understood that layer 62 is an optional layer. The layers 58, 60 and 62 may be formed, in one form, by conventional deposition techniques. A patterned photoresist layer 64 overlies layer 62 for defining the position of an electrode that is closest to a device layer as well as defining conductive routing for the backside. In one form, the conductive routing is for defining power and ground conductors or other circuit routing.

Figure 9:
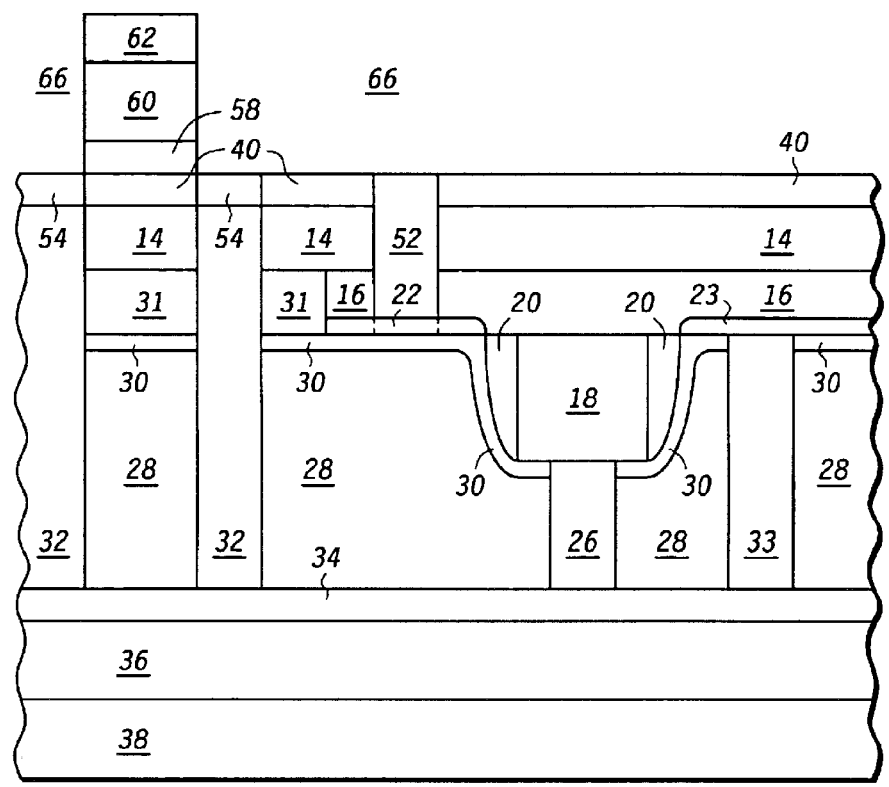

Illustrated in FIG. 9 is semiconductor device 10 wherein the pattern defined by photoresist layer 64 is transferred into layers 62, 60 and 58 to form openings 66. The pattern transfer, in one form, may be implemented with either conventional dry or wet etching techniques.

Figure 10:
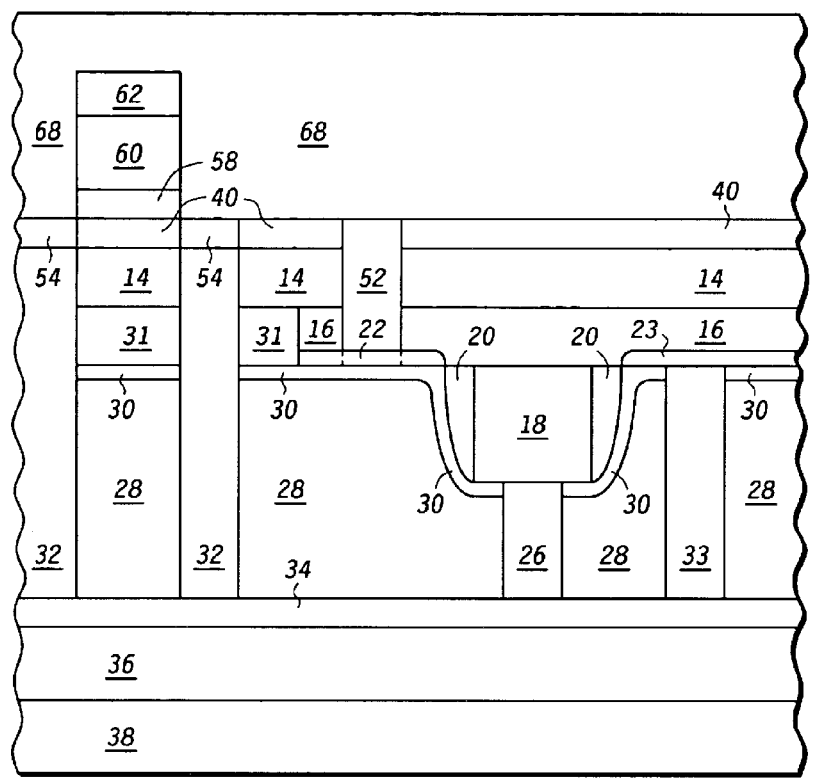

Illustrated in FIG. 10 is semiconductor device 10 wherein openings 66 are filled with a conductive material 68 that functions as a first metal structure by using conventional deposition techniques. In one form, the conductive material 68 is a metal and forms a metal structure. In one form, conductive material 68 may be implemented with copper, silver, tungsten, nickel, gold, aluminum and alloys thereof, as well as other metals. It should be apparent that conductive region 52, conductive regions 54 and conductive material 68 may be formed using conventional dual in-laid patterning, etch and fill techniques.

Figure 11:
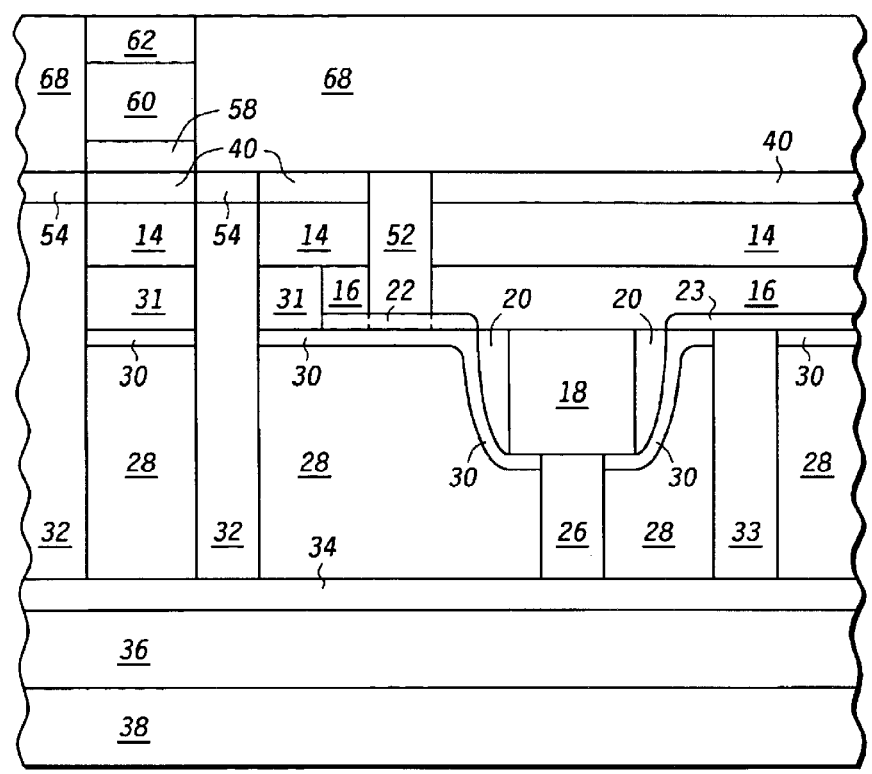

Illustrated in FIG. 11 is semiconductor device 10 wherein conductive material 68 is planarized to form isolated portions of conductive material 68. Conventional planarization techniques, such as CMP, may be used to implement this process step. In an alternate form, the planarization process may remove enough of conductive material 68 that layer 62 is also removed. It should be observed that at this point in the processing there has been provided a metal structure in the form of conductive material 68 for providing a back bias for a transistor that will be formed around gate electrode 18. In this form, conductive region 52 is not required. It is desired for this embodiment that the thicknesses of layers 14 and 40 be minimized.

Figure 12:
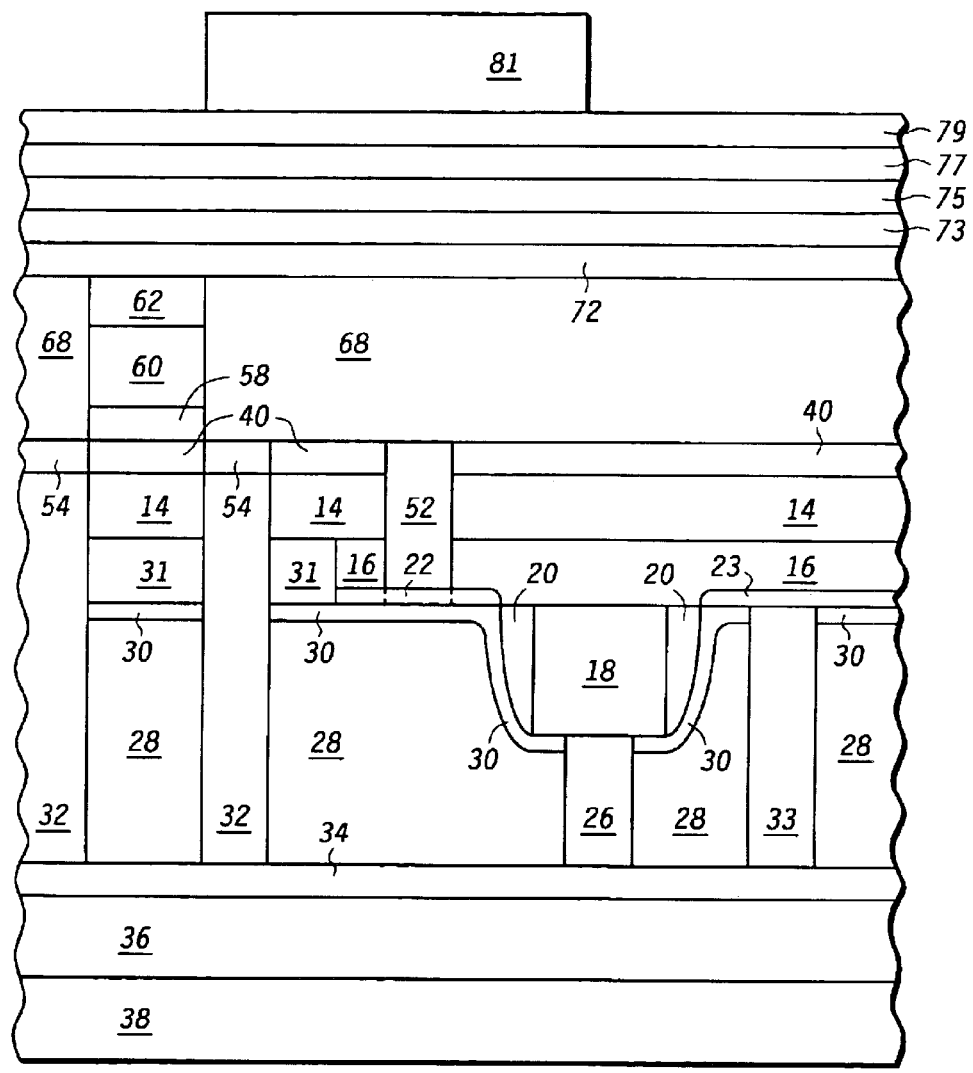

Illustrated in FIG. 12 is semiconductor device 10 wherein a barrier layer 72 overlies conductive material 68 and layer 62. In one form, barrier layer 72 is implemented with a dielectric. In other forms, barrier layer 72 could be implemented with a conductive material deposited only on the metallic regions of conductive material 68 (i.e. electroless barriers). An oxide layer 73 overlies barrier layer 72. A first plate electrode formed of conductive material 75 of a decoupling capacitor overlies the oxide layer 73. The first plate electrode conductive material 75 is conductive and is typically a metal such as tantalum nitride, aluminum, tantalum, titanium nitride and others. An insulating layer 77 overlies the first plate electrode conductive material 75 and is preferably a high k dielectric material having a dielectric constant in the range of 4.0 or greater. A second plate electrode formed by conductive material 79 overlies the insulating layer 77. The second plate electrode conductive material 79 is also a conductor. A photoresist 81 overlies the semiconductor device 10 and forms a pattern to define a second plate electrode from the first plate electrode conductive material 75.

Figure 13:
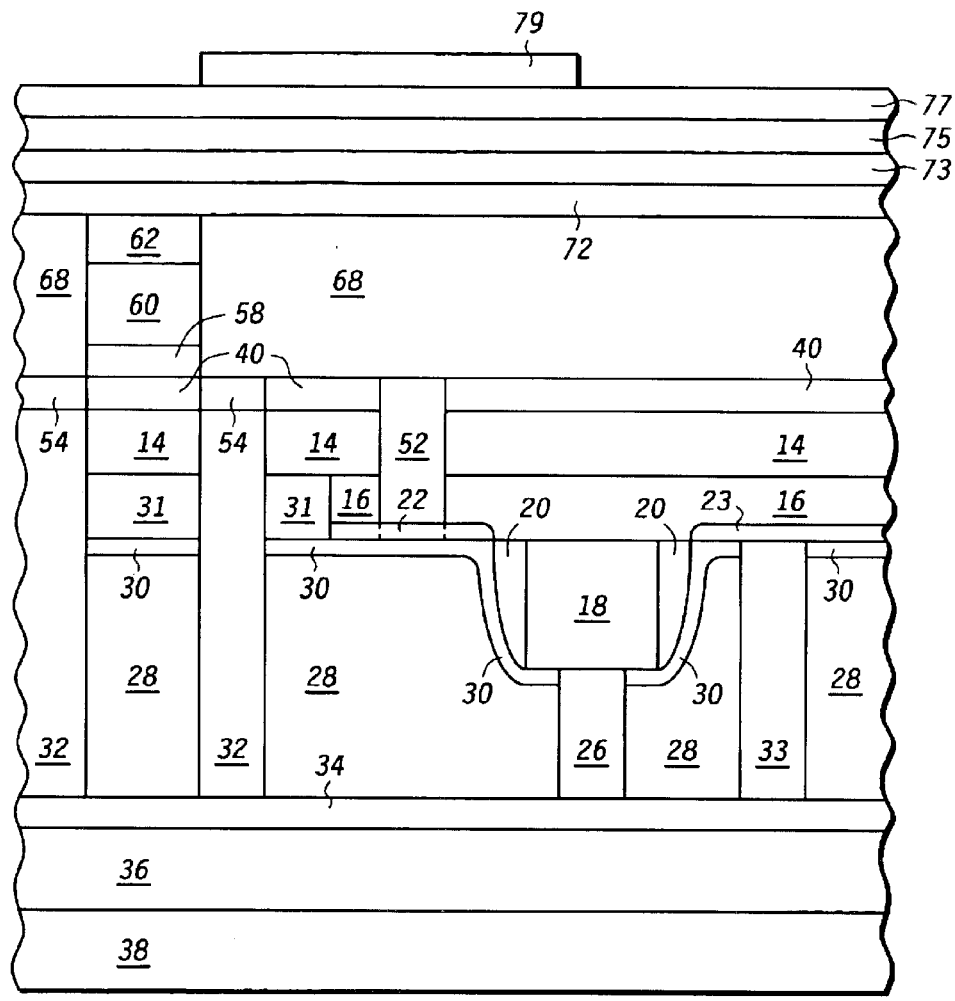

Illustrated in FIG. 13 is semiconductor device 10 wherein the second plate electrode conductive material 79 is formed as a result of a conventional etch process.

Figure 14:
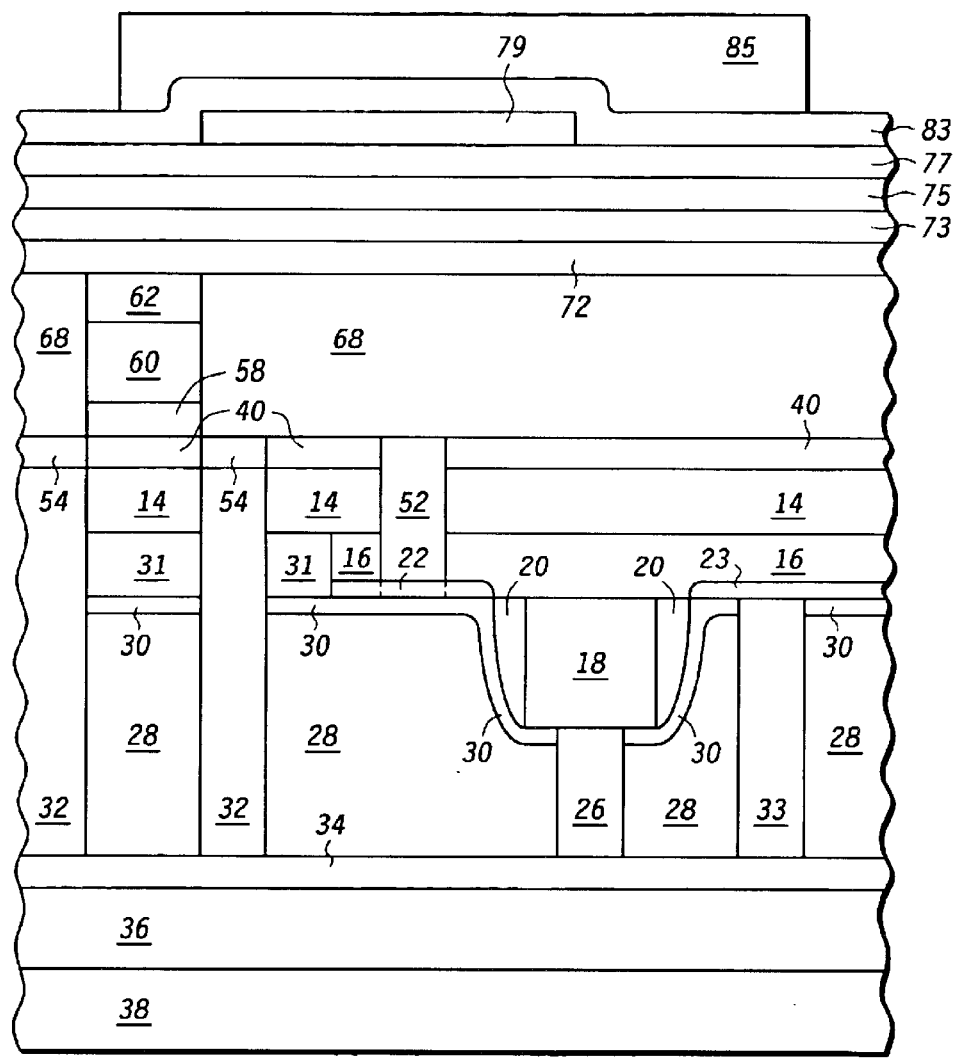

Illustrated in FIG. 14 is semiconductor device 10 wherein a nitride layer 83 is formed overlying the top of the second plate electrode conductive material 79 as an etch stop layer. Photoresist 85 defines the first electrode layer pattern.

Figure 15:
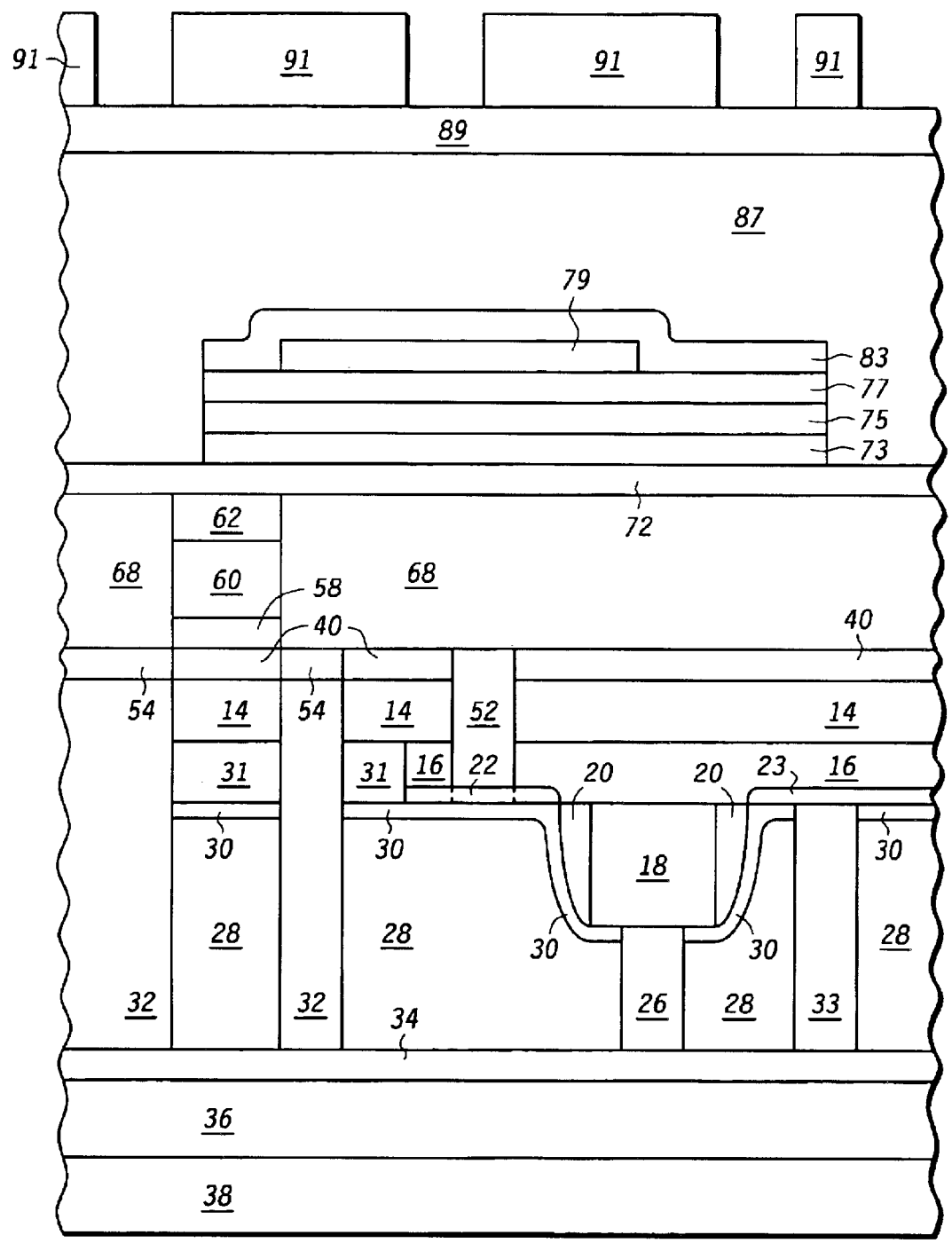

As illustrated in FIG. 15, the pattern of photoresist 85 is transferred into the layers 73, 77 and 83 and conductive material 75. The pattern may be transferred using a conventional dry etch or wet etch or a combination thereof and is selective to the etch stop or barrier layer 72. Photoresist 81 is removed from the semiconductor device 10. A subsequent oxide film 87 that functions as an insulating layer is deposited and planarized (in one form, a polish) to form a planar upper surface. A hard mask layer 89 is formed overlying the oxide film 87. A photoresist 91 defines via openings for the semiconductor device 10 for contact to the first and second capacitor plates in addition to conductive material 68. It should be noted that the capacitor formed by the metal structure or conductive material 75, the insulating layer 77, and the metal structure or conductive material 79 has at least a portion of which is located on a line that is orthogonal to the surface of active layer 16 and through the active device (transistor formed by gate 18, source region 22 and drain region 23). It should be understood that source region 22 and drain region 23 may be implemented as either a source/drain region or a drain/source region depending upon conductivity doping.

Figure 16:
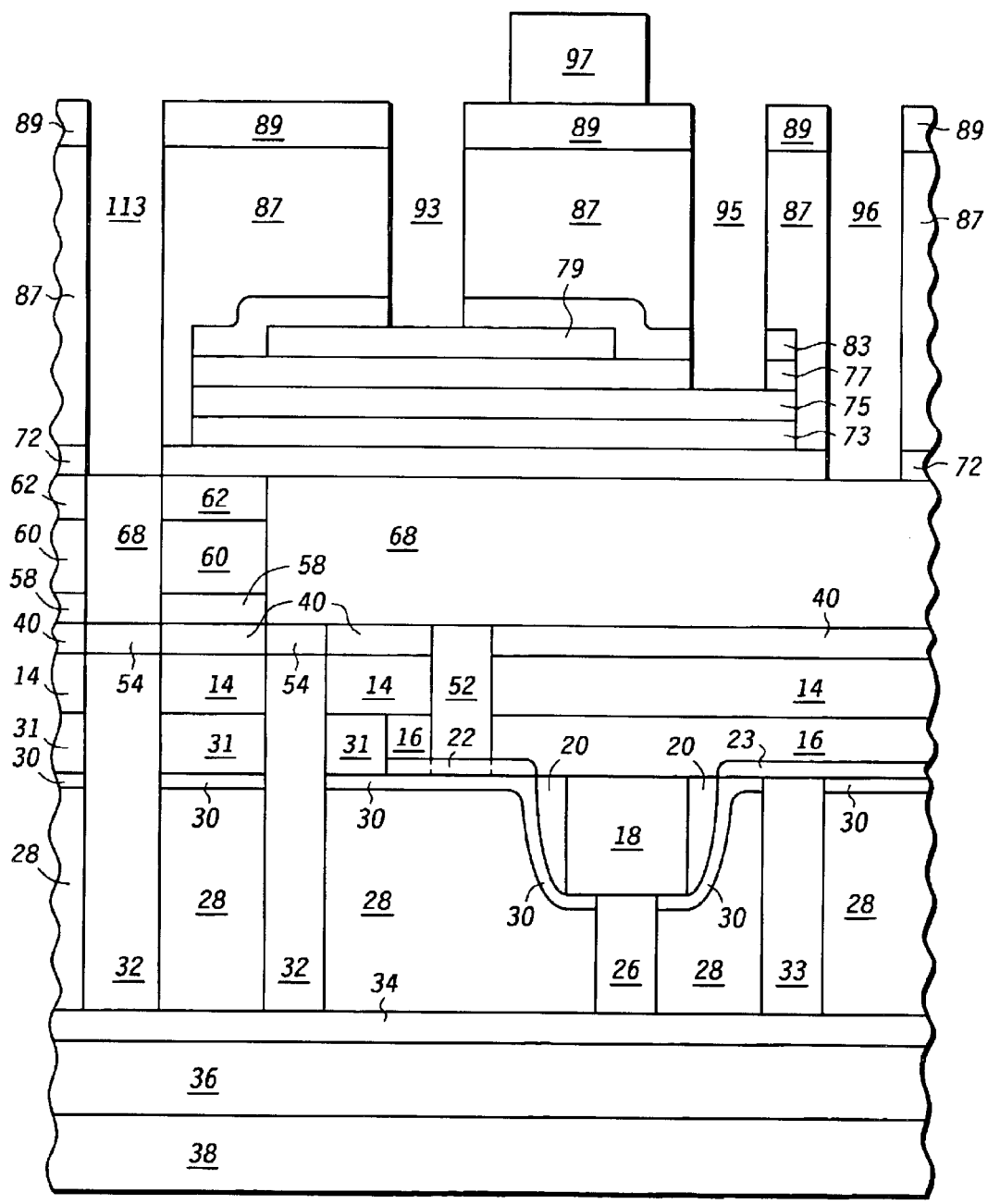

As illustrated in FIG. 16, the via openings are etched in the form of a through contact via 113, a topside electrode via 93, a bottom side electrode via 95 and a via 96. Photoresist 97 defines metal openings. Layer 89 acts as an antireflective coating (ARC) material or as a hard mask material similar to layer 62.

Figure 17:
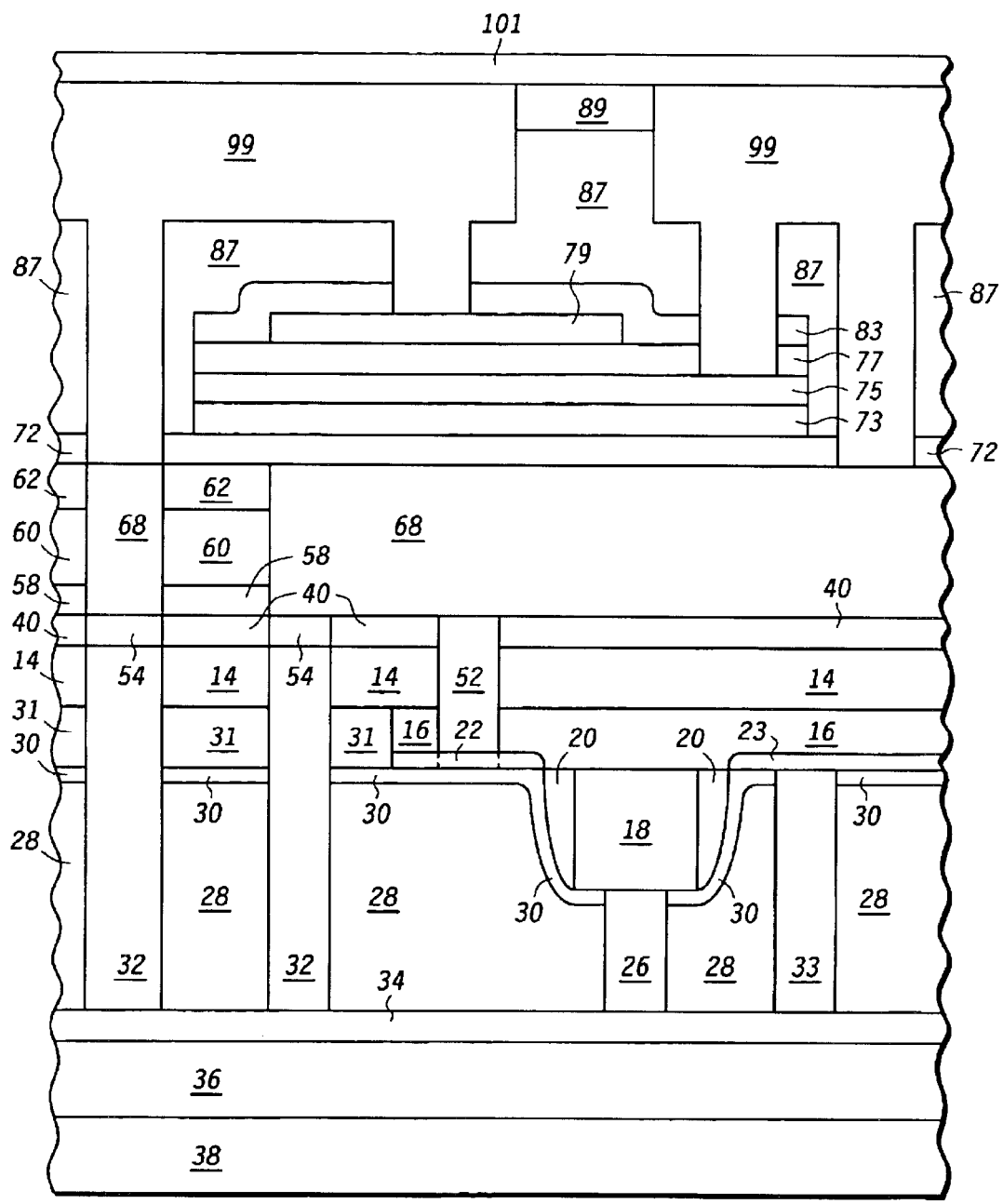

As illustrated in FIG. 17, the pattern defined by photoresist 97 is transferred into layer 89 and oxide film 87. The pattern transfer, in one form, may be implemented with either conventional dry or wet etching techniques. Openings are filled with a conductive material 99 that functions as a second metal structure by using conventional deposition techniques. In one form, the conductive material 99 is a metal and forms a metal structure. In one form, conductive material 99 may be implemented with copper, silver, tungsten, nickel, gold, aluminum and alloys thereof, as well as other metals. It should be apparent that conductive material 99 in the regions illustrated may be formed using conventional dual in-laid patterning, etch, fill and planarization techniques similar to FIG. 11. In FIG. 17 a passivation layer 90 is deposited on conductive material 99 and layer 89. In one form, the passivation layer 90 may be a carbide, nitride, oxide material or other dielectric materials.

In this embodiment, an active device in the form of a transistor is formed by polysilicon gate 18 and the associated gate oxide (not shown), backside source region 22 and drain region 23. Assume that in addition to the transistor illustrated, novel structures such as FinFETs or vertical transistors may be used in lieu of a conventional MOSFET. Directly underneath the active device (i.e. the illustrated transistor) is formed a passive device in the form of a capacitive element that functions in one application as a decoupling capacitor. A portion of the decoupling capacitor is positioned along a line that runs through any portion of the transistor wherein the line is orthogonal to a surface of active layer 16.

Figure 18:
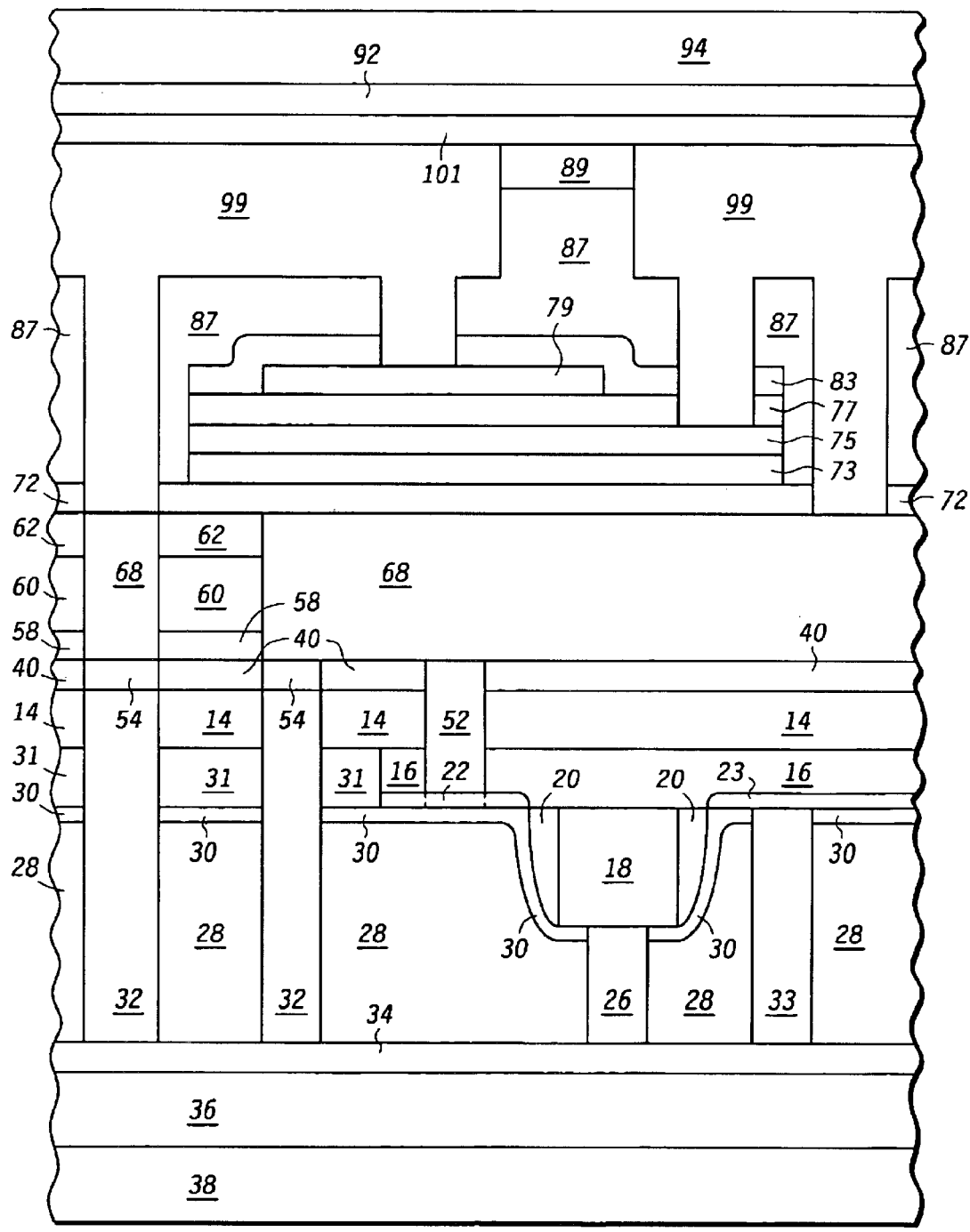

Illustrated in FIG. 18 is semiconductor device 10 wherein a final substrate 94 is joined to a passivation layer 101 through a bonding layer 92. It should be understood that multiple conductive layers (not shown) may separate the conductive material 88 and the passivation layer 101. In addition, bonding layer 92 and final substrate 94 may be eliminated and replaced by multiple conductive layers (not shown) to form a conductive bump structure. In such an embodiment, the carrier substrate 38 is the final substrate.

Figure 19:
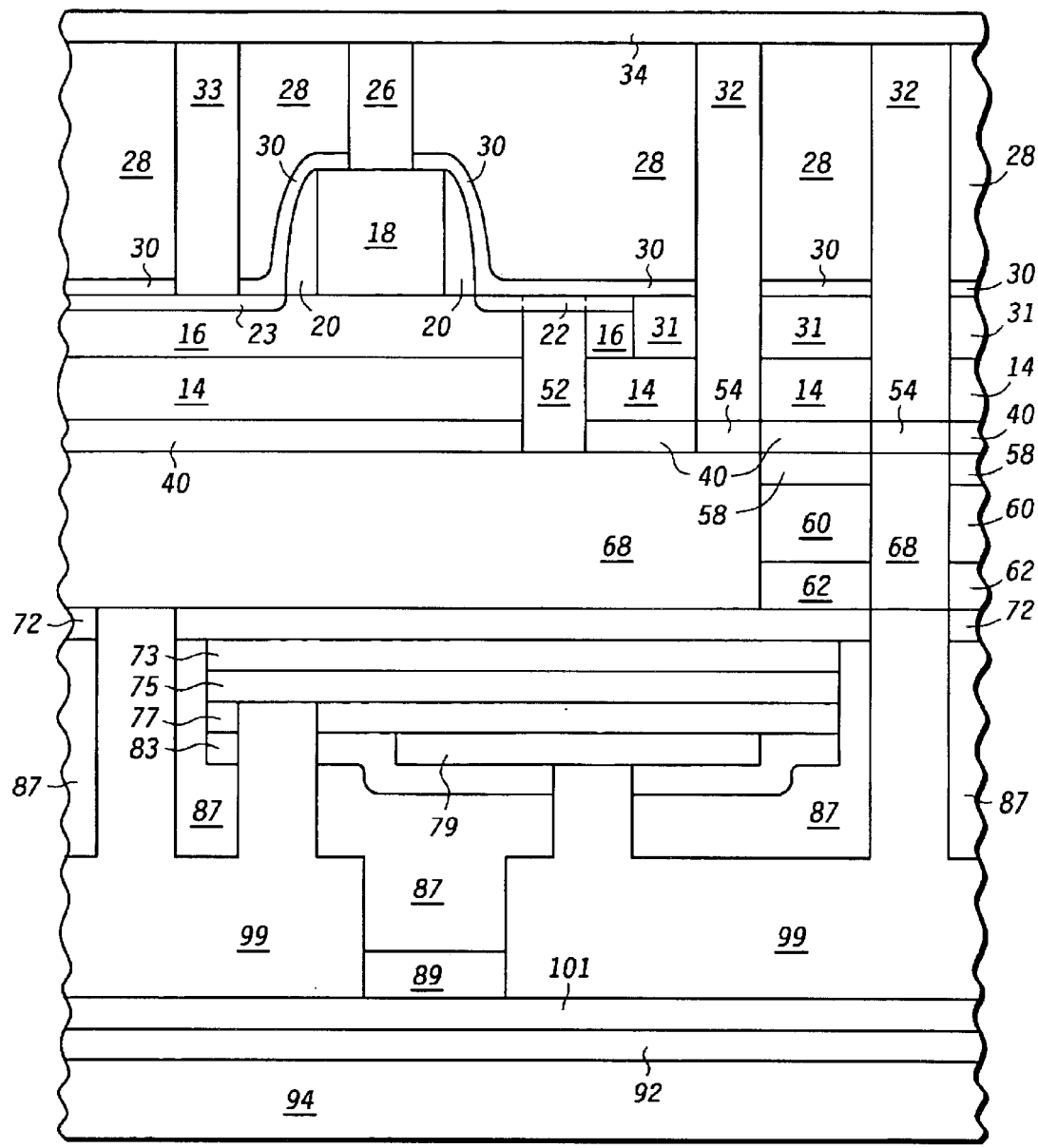

Illustrated in FIG. 19 is semiconductor device 10 wherein the carrier substrate 38 and the bonding layer 36 is removed. This removal process may include conventional techniques such as grinding, chemical mechanical polish (CMP), wet or dry etching selective to the etch stop layer 34. In addition, this removal process may include non-contact removal techniques such as laser lift-off, decomposition of the adhesive material, decomposition of bonds, etc. Final substrate 94 therefore becomes a final substrate for semiconductor device 10. Further processing for metal layer formation and C4 attachment may be implemented pursuant to conventional processing techniques.

By now it should be appreciated that there has been provided a method for forming a semiconductor device wherein a passive device is formed directly beneath an active device. In the illustrated form, the passive device is implemented as a capacitor formed by conductive material 75 and conductive material 79 as first and second plate electrodes, respectively, and layer 73 as the intervening dielectric. Conductive material 79 of the capacitor is contacted to the front side by the interconnect formed by conductive material 99 and 68 and conductive regions 54 and one of backside contacts 32. Conductive material 75 of the capacitor is also connected to the transistor (i.e. the active device) by conductive material 99, 68 and conductive region 52 to the backside source region 22. Additionally, conductive material 68 may be implemented as an efficient power plane across a semiconductor die to distribute a power supply voltage across the semiconductor device 10. The power plane would provide direct power to the transistor without having a lateral power plane that would consume circuit layout area. Additionally, the power plane of conductive material 68 may be used to provide a back bias for the overlying transistor and change the transistor characteristics by applying a predetermined bias to the power plane. In such an implementation, conductive region 52 is not connected to the power plane being used to provide this bias. This bias modifies the depletion region of the transistor. Control of the biasing may be implemented so that sections of transistors within an integrated circuit may be biased by such a power plane for a predetermined type of circuit operation or during certain periods of operation, such as for example a period dependent upon the amount of power being consumed.

In the foregoing specification, the invention has been described with reference to specific embodiments. However, one of ordinary skill in the art appreciates that various modifications and changes can be made without departing from the scope of the present invention as set forth in the claims below. For example, any type of active device other than a transistor may be implemented such as diodes, photodetectors, MEM (micro electro mechanical) devices and optical sources. Various transistor structures that have a diffusion region may be implemented. Any type of passive device other than a capacitor may be implemented, such as resistors, inductors, waveguides, cavities, optical interconnects, optical components, couplers, heat dissipation elements and heat sinks. Any type of packaging interconnects may be incorporated with semiconductor device 10 both at the front-side and the back-side. Various materials other than the specific examples described herein may be used for the conductors and insulators described herein. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A semiconductor device comprising:
   a semiconductor layer having a first surface and a second surface, the second surface opposite the first surface;
   a diffusion region formed at the first surface of the semiconductor layer, the diffusion region having a top surface at the first surface of the semiconductor layer and a bottom surface; and
   a first via formed in the semiconductor layer, the first via having a first end formed at the second surface and a second end formed at the bottom surface of the diffusion region;
   a first metal structure over the second surface;
   an insulating layer on the first metal structure;
   a second metal structure, a portion of which is over the insulating layer;
   a second via for coupling the first metal structure at least at or below a plane of the first surface; and
   a third via for coupling the second metal structure at least at or below the plane of the first surface.

2. The semiconductor device of claim 1, wherein the diffusion region forms a source/drain region of a transistor.

3. The semiconductor device of claim 1 further comprising an insulator for electrically separating the second metal structure into a first portion and a second portion.

4. The semiconductor device of claim 1, further comprising a capacitive element having a first plate electrode connected to a first portion of the second metal structure and a second plate electrode connected to a second portion of the second metal structure electrically separated from the first portion of the second metal structure.

5. The semiconductor device of claim 4, further comprising a first substrate and a second substrate on external opposing sides of the semiconductor device.

6. The semiconductor device of claim 1 wherein the diffusion region forms a source/drain region of a transistor and the first metal structure forms a gate region of the transistor, the gate region being surrounded by a sidewall spacer.

7. The semiconductor device of claim 6, wherein the first metal structure, the second metal structure, and the insulating layer are used to form a decoupling capacitor for an integrated circuit.

8. The semiconductor device of claim 6, wherein at least one of the first metal structure and the second metal structure is used to distribute a power supply voltage across the semiconductor device.

9. The semiconductor device of claim 6, wherein the first metal structure is for providing a back bias for a transistor.

10. The semiconductor device of claim 6, further comprising:
    a capacitor coupled to the transistor.

11. The semiconductor device of claim 6, further comprising:
    a passivation layer formed over the second metal structure;
    a bonding layer deposited on the passivation layer; and
    a substrate attached to the passivation layer using the bonding layer.

* * * * *